(12) United States Patent
Une et al.

(10) Patent No.: US 8,143,175 B2
(45) Date of Patent: Mar. 27, 2012

(54) DRY ETCHING METHOD

(75) Inventors: Satoshi Une, Kudamatsu (JP);
Masamichi Sakaguchi, Kudamatsu (JP);
Kenichi Kuwabara, Hikari (JP);
Tomoyoshi Ichimaru, Kudamatsu (JP)

(73) Assignee: Hitachi High-Technologies Corporation, Tokyo (JP)

( * ) Notice: Subject to any disclaimer, the term of this patent is extended or adjusted under 35 U.S.C. 154(b) by 387 days.

(21) Appl. No.: 12/435,787

(22) Filed: May 5, 2009

(65) Prior Publication Data

US 2009/0280651 A1 Nov. 12, 2009

Related U.S. Application Data

(63) Continuation of application No. 11/505,292, filed on Aug. 17, 2006, now abandoned.

(30) Foreign Application Priority Data

Mar. 1, 2006 (JP) .................................. 2006-054914

(51) Int. Cl.
*H01L 21/31* (2006.01)

(52) U.S. Cl. .......... 438/787; 438/689; 438/692; 216/67; 216/68; 216/79; 257/758; 257/760

(58) Field of Classification Search .......... 438/689–692; 216/67, 68, 79; 257/758, 760
See application file for complete search history.

(56) References Cited

U.S. PATENT DOCUMENTS

| 4,980,317 | A | | 12/1990 | Koblinger et al. | |
|---|---|---|---|---|---|
| 5,796,167 | A | * | 8/1998 | Koga | 257/758 |
| 5,818,110 | A | | 10/1998 | Cronin | |
| 5,830,807 | A | | 11/1998 | Matsunaga et al. | |
| 6,037,267 | A | | 3/2000 | Kim et al. | |
| 6,900,139 | B1 | | 5/2005 | Dakshina-Murthy et al. | |
| 2002/0173150 | A1 | * | 11/2002 | Kawai et al. | 438/690 |
| 2005/0151262 | A1 | | 7/2005 | Tamaru et al. | |
| 2005/0266593 | A1 | * | 12/2005 | Suzawa et al. | 438/30 |

FOREIGN PATENT DOCUMENTS

| JP | 56-100421 | 8/1981 |
|---|---|---|
| JP | 56-144542 | 11/1981 |
| JP | 7-307328 | 11/1995 |
| JP | 09-237777 | 9/1997 |
| JP | 2002-151470 | 5/2002 |
| JP | 2003-163349 | 6/2003 |
| TW | 452971 | 9/2001 |

* cited by examiner

*Primary Examiner* — Binh X Tran
*Assistant Examiner* — Maki Angadi
(74) *Attorney, Agent, or Firm* — Antonelli, Terry, Stout & Kraus, LLP.

(57) ABSTRACT

The invention provides a dry etching method for performing a wiring process on a semiconductor substrate using a plasma etching apparatus, wherein the wiring process is performed without causing disconnection or deflection of the wiring. The invention provides a dry etching method for performing a wiring process on a semiconductor substrate using a plasma etching apparatus, wherein during a step for etching a material 12 to be etched using a mask pattern composed of a photoresist 15 and inorganic films 14 and 13 made of SiN, SiON, SiO and the like formed on the material 12 to be etched, a mixed gas formed of a halogen-based gas such as chlorine-containing gas or bromine-containing gas and at least one fluorine-containing gas selected from a group of fluorine-containing gases composed of $CF_4$, $CHF_3$, $SF_6$ and $NF_3$ is used to reduce the mask pattern and the processing dimension of the material to be etched substantially equally during processing of the material 12 to be etched.

8 Claims, 4 Drawing Sheets

RELATIONSHIP BETWEEN RF BIAS AND REDUCTION RATIO

REDUCTION QUANTITY
= A (INITIAL DIMENSION) – B (POST-ETCHING DIMENSION)

DRY ETCHING METHOD

The present application is based on and claims priority of Japanese patent application No. 2006-54914 filed on Mar. 1, 2006, the entire contents of which are hereby incorporated by reference. This application is a Continuation application of application Ser. No. 11/505,292 filed Aug. 17, 2006 now abandoned, the contents of which are incorporated herein by reference in their entirety.

BACKGROUND OF THE INVENTION

1. Field of the Invention

The present invention relates to a method for etching semiconductor devices. More specifically, the present invention relates to a dry etching method capable of reducing the wiring dimension without causing defective pattern by reducing the processing dimension simultaneously while processing a material to be etched which is the wiring layer disposed on the semiconductor substrate.

2. Description of the Related Art

Recently, along with the advanced integration technology accompanying the increase in processing speed of semiconductor devices, there are increasing demands for enhancing the miniaturization processes in the field of gate material processing and the like. In the field of dry etching, generally in order to miniaturize the pattern, the photoresist pattern used as the mask is reduced in dimension via dry etching prior to processing the material to be etched, so as to reduce the processing dimension of the material to be etched.

Along with the further advancement of miniaturization, ArF resist has been adopted as the material for the photoresist mask capable of being exposed via an ArF laser, which is capable of forming a micropattern with higher accuracy. However, since ArF resist cannot be deposited as thick as the conventional mask members, and since ArF has a high etching rate, it has a property vulnerable to etching. Therefore, the ArF resist has a drawback in that the mask is removed during processing of the material to be etched, making it impossible to perform fine wiring process of the material to be etched with high accuracy. In order to overcome this problem, an inorganic film layer composed of SiON, SiN, SiO or the like is disposed between the photoresist mask and the material to be etched, wherein the inorganic film layer is processed via dry etching using a reduced photoresist mask pattern, according to which an inorganic film mask having a slow etching rate is formed to realize stable processing of the material to be etched. This technique is disclosed for example in Japanese patent application laid-open publication No. 9-237777 (patent document 1).

However, according to the method for reducing the photoresist pattern dimension via dry etching, it is necessary to ensure a photoresist mask thickness required for processing the inorganic film layer, so there is a limitation in the reduction thickness of the processing dimension.

SUMMARY OF THE INVENTION

The object of the present invention is to provide a dry etching method capable of reducing the processing dimension during processing of the material to be etched, and realizing fine processing without causing drawbacks such as disconnection and deflection of the material to be etched due to mask defection.

The above object can be realized by using a patterned photoresist as the mask so as to process an inorganic layer via dry etching to form an inorganic film mask, and then simultaneously reducing the inorganic film mask and the material to be etched during the process for etching the material to be etched.

According to this processing method, since the pattern dimension of the inorganic film mask is reduced after forming the inorganic film mask, drawbacks such as collapse of the photoresist mask do not occur.

Furthermore, even by adopting the conventional method for reducing the photoresist mask dimension via dry etching together with the present invention, there is no need to perform excessive reduction of the photoresist mask, so the conventional problems such as collapse of pattern or disconnection of the wiring layer by reduction do not occur.

By the methods described above, the present invention enables to reduce the processing dimension significantly and perform fine wire processing without causing disconnection or deflection of the wiring of the material to be etched which may accompany the reduction of the processing dimension.

DETAILED DESCRIPTION OF THE PREFERRED EMBODIMENTS

Figure 1:
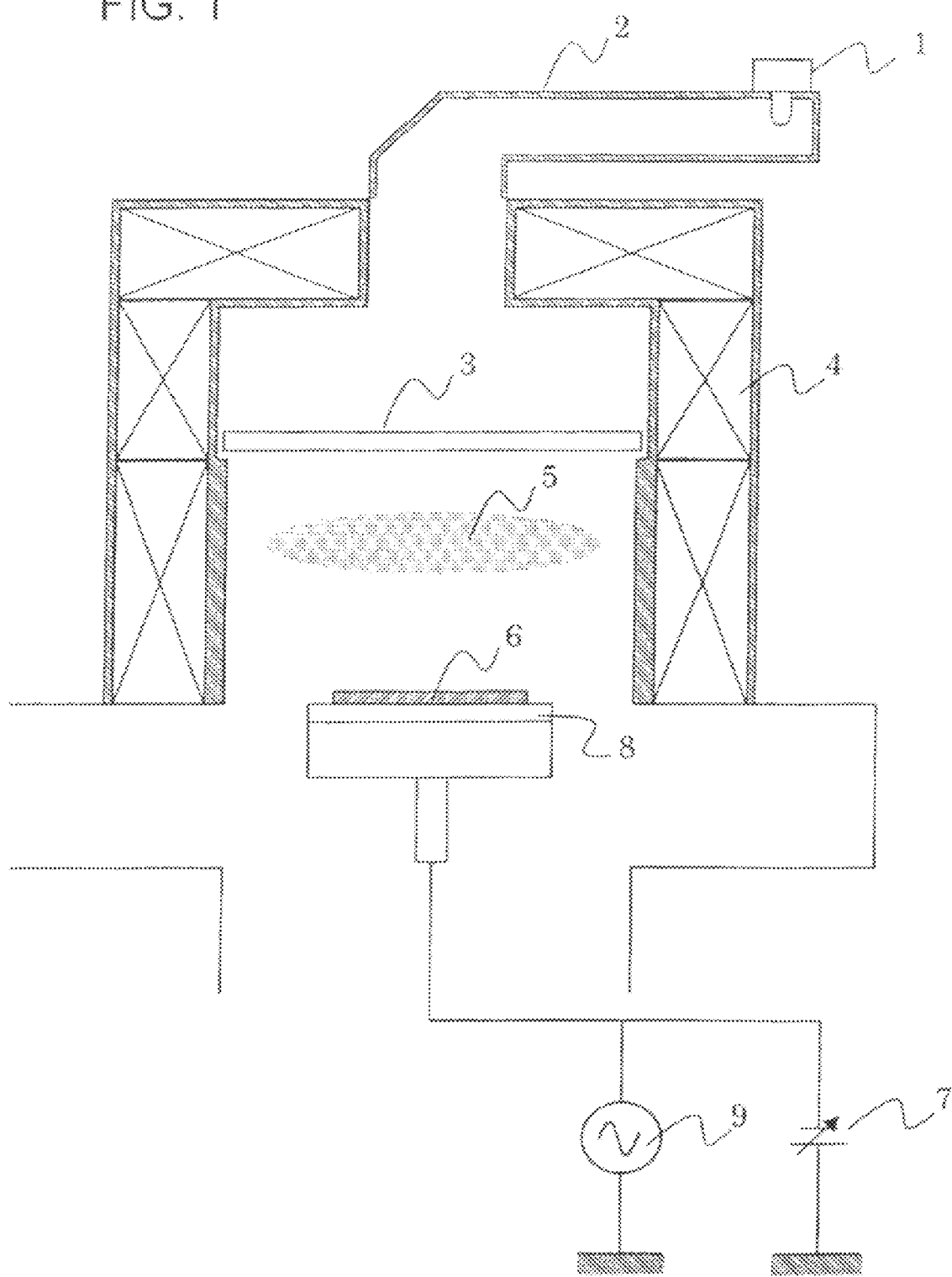
FIG. 1 is a schematic cross-sectional view of a microwave plasma etching apparatus to which the etching method of the present invention is applied.

Now, the plasma etching method according to the present invention will be described. FIG. 1 illustrates a plasma etching apparatus to which the dry etching method according to the present invention is applied. The illustrated plasma etching apparatus is an example of a microwave plasma etching apparatus utilizing microwaves and magnetic field as means for generating plasma. Microwaves generated by a magnetron 1 travel through a waveguide 2 and a quartz panel 3 to enter a vacuum chamber. Solenoid coils 4 are disposed around the vacuum chamber, which generate a magnetic field that acts together with the microwaves entering the vacuum chamber to cause electron cyclotron resonance (ECR). Thereby, process gases can efficiently be turned into plasma 5 with high density. A processing wafer 6 is held onto the electrode via electrostatic chuck by applying a DC voltage to a substrate stage 8 from an electrostatic chuck power supply 7. Furthermore, a high-frequency power supply 9 is connected to the electrode, applying high-frequency power (RF bias) so as to provide an accelerating potential in the perpendicular direction with respect to the wafer to the ions in the plasma. The gas used for etching is discharged after etching through an exhaust port disposed on the lower portion of the apparatus via a turbo pump—dry pump (not shown).

Plasma etching apparatuses such as a microwave plasma etching apparatus, an inductively coupled plasma etching apparatus, a helicon wave plasma etching apparatus and a double-frequency-excited parallel plate plasma etching apparatus are adopted.

Figure 2A:
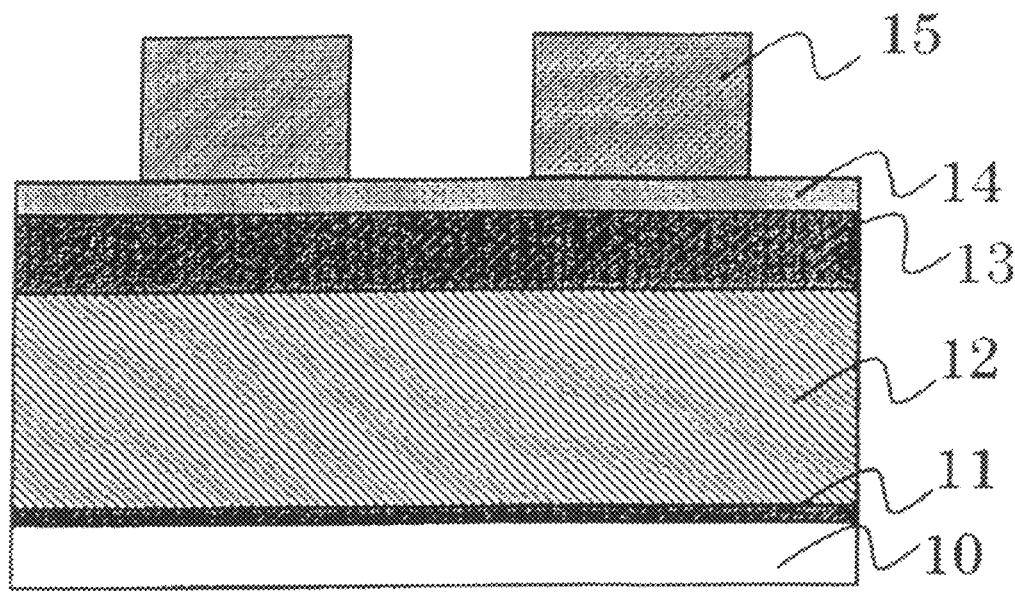
FIG. 2A is a cross-sectional view showing the relevant portion of a semiconductor substrate after forming a resist mask according to an embodiment of the present invention.
Figure 2B:
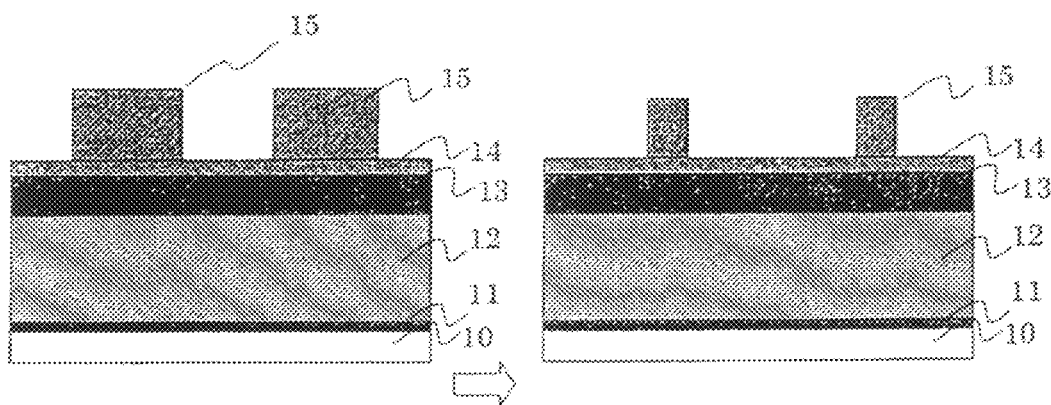
FIG. 2B is a cross-sectional view showing the relevant portion of a semiconductor substrate during a resist mask reduction process according to an embodiment of the present invention.
Figure 2C:
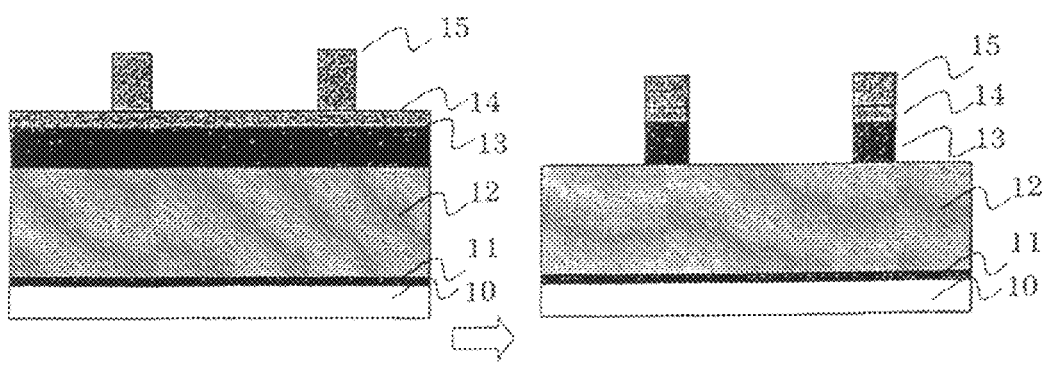
FIG. 2C is a cross-sectional view showing the relevant portion of a semiconductor substrate during the etching process of SiON film and SiN film according to an embodiment of the present invention.
Figure 2D:
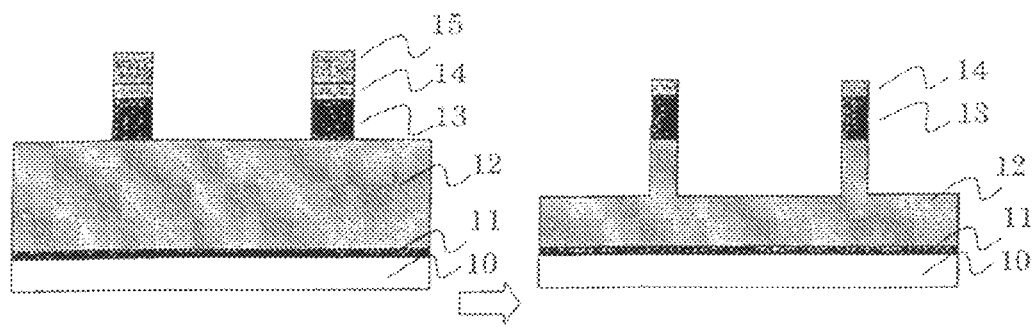
FIG. 2D is a cross-sectional view showing the relevant portion of a semiconductor substrate during the etching process for reducing the SiON film and SiN film and reducing the polysilicon film according to an embodiment of the present invention.
Figure 2E:
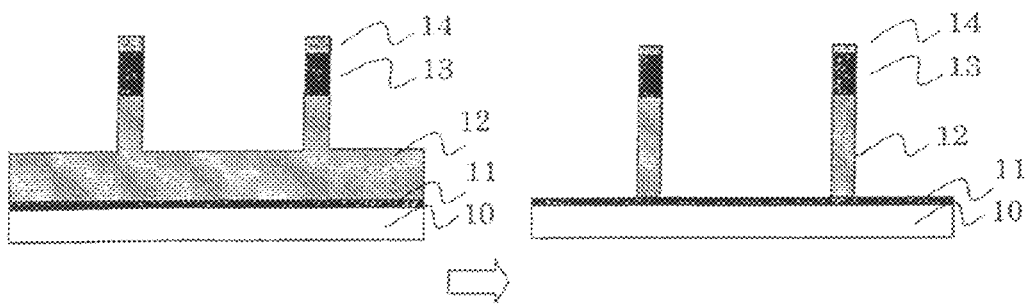
FIG. 2E is a cross-sectional view showing the relevant portion of a semiconductor substrate during the etching process of the polysilicon film according to an embodiment of the present invention.

FIGS. 2A through 2E illustrate the manufacturing method of a semiconductor device using the plasma etching apparatus of FIG. 1. FIG. 2A shows the structure of a sample used in the present embodiment, FIG. 2B shows the step of reducing the processing dimension of the photoresist mask, FIG. 2C shows the mask forming process of the SiON film and SiN film, FIG. 2D shows the step of processing the mask and polysilicon film and the step of reducing the processing dimension, and FIG. 2E shows the step of processing the polysilicon film.

The example of the structure of a sample used according to one preferred embodiment of the present invention is shown in FIG. 2A. A gate oxide film 11 (2 nm), a polysilicon film 12 (film thickness 100 nm), an SiN film 13 (50 nm), an SiON film 14 (25 nm) and a photoresist 15 (250 nm) are sequentially formed on a silicon substrate 10 with a diameter of 12 inches, and thereafter, a mask pattern is formed via photolithography technology.

FIG. 2B shows the step of reducing the processing dimension of the photoresist mask that has been performed conventionally, and for example, etching is performed using plasma generated from a mixed gas having $O_2$ gas added to Ar gas, with the processing pressure set to 0.2 Pa and the microwaves set to 600 W. The $O_2$ gas flow rate determines the reducing rate of the photoresist, and approximately 10% of $O_2$ gas is added so as to set the reduction rate to approximately 1.5 nm/sec. The reduction rate increases by increasing the amount of $O_2$ gas. According to the present embodiment, a pattern with an initial photoresist pattern dimension of 100 nm is subjected to processing for 43 seconds, by which the photoresist pattern dimension is narrowed down to 35 nm.

According to the mask forming process shown in FIG. 2C, the photoresist 15 is used as a mask to etch the SiON film 14 and the SiN film 13. The etching process is performed while having the interface with the polysilicon film 12 detected via an etching monitor such as an EPD (end point detector). As for processing conditions, for example, etching is performed by applying 100 W of RF bias to plasma generated from a mixed gas composed of $CF_4$ gas and $CHF_3$ gas mixed with a ratio of 1:1 and with the processing pressure set to 0.8 Pa. The etching of the SiN film 13 is ended when the surface of the polysilicon film 12 is detected.

The step of reducing the processing dimension of the polysilicon film illustrated in FIG. 2D is the characteristic step of the present invention, wherein the pattern dimension is reduced by performing etching in the depth direction and simultaneously performing etching in the lateral direction using the pattern of the SiON film 14 and the SiN film 13 formed in FIG. 2C as the mask. By using $CF_4$ together with $Cl_2$, it becomes possible to etch the mask material simultaneously while etching the polysilicon film 12. As for processing conditions, for example, 30 W of RF bias is applied to plasma generated by applying 900 W of microwaves to a mixed gas composed of $Cl_2$ gas and $CF_4$ gas with a ratio of 1:3 and a processing pressure of 0.2 Pa, so as to perform etching both in the depth direction and the lateral direction.

Figure 3A:
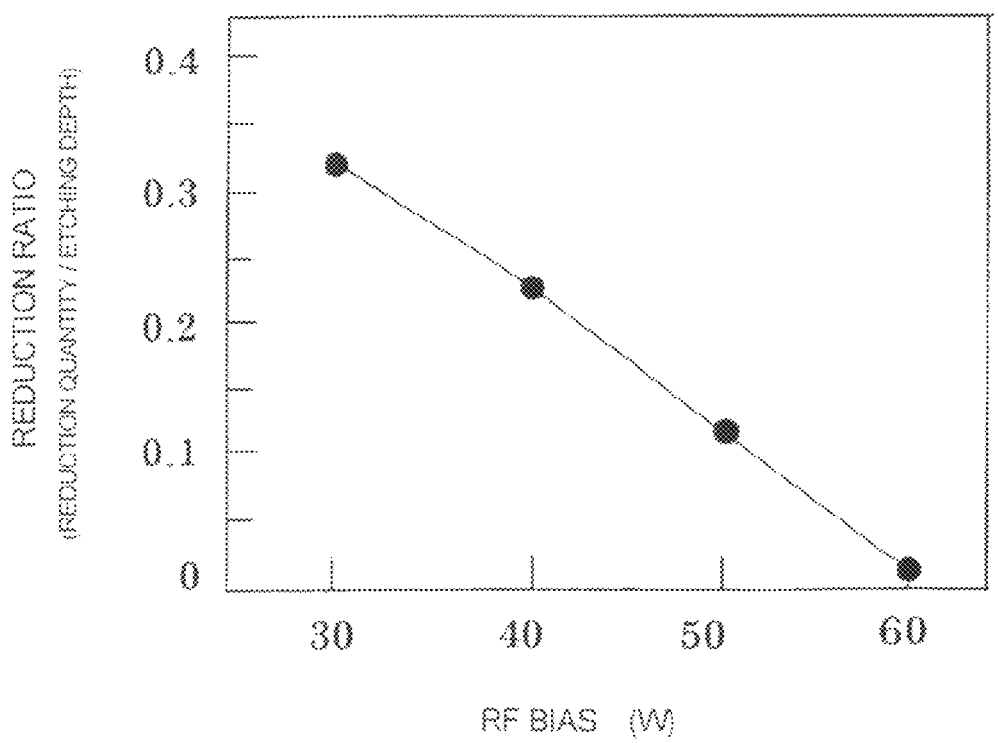
FIG. 3A is a graph describing the RF bias dependency of the reduction rate according to the present invention.

Now, the etching thickness of the polysilicon in the lateral direction depends on the application thickness of the RF bias, as shown in FIG. 3A, and according to the present embodiment, the processing conditions are optimized so that the reduction ratio in the lateral direction with respect to the depth direction is approximately 0.32. According to the present embodiment, processing is performed under this processing condition until approximately 50 nm which is half the thickness 100 nm of the polysilicon film 12 is etched, and then the pattern reduced to 35 nm via the processing dimension reduction step of the photoresist 14, the SiON film 14 and the SiN film 13 is further reduced by 16 nm to obtain a pattern with a dimension of 19 nm. According to this processing step, the photoresist 14 is totally etched, and thereafter, the SiON film 14 and the SiN film 13 are used as the mask. According to this step, isotropic etching can be continued until either the photoresist 14 is gone or the mask width reaches a determined size, which for example is 19 nm. The reduction thickness according to FIG. 3A is the value obtained by subtracting dimension B of the mask width after etching from the initial dimension A of the mask width, and the reduction ratio is the value obtained by dividing this reduction thickness by the etching depth of the polysilicon film.

In the processing step of the polysilicon film 12 shown in FIG. 2E, the processing dimension of the polysilicon subjected to reduction in the former step is maintained while the remaining polysilicon film is etched. As for processing conditions, for example, etching is performed by applying 30 W of RF bias to plasma generated by applying 900 W of microwaves to a mixed gas having $O_2$ gas added to HBr gas in the amount of approximately 4% of the HBr gas flow rate, with the processing pressure set to 0.4 Pa. According to the etching conditions in this step, the etching of the polysilicon in the lateral direction will not occur, and the etching is performed while maintaining the processing dimension formed in the upper layer.

Thereby, the present embodiment enables to realize a polysilicon wiring process with a width of 19 nm without causing any disconnection or deflection (side etching) of the material being etched by using a mask pattern having an initial dimension of 100 nm.

Similarly, the prior art attempt to perform polysilicon processing to realize a 19 nm width polysilicon just by reducing the pattern dimension of the photoresist 15 of FIG. 2B requires the photoresist to be reduced as much as 80 nm, which caused the photoresist pattern to fall down, causing drawbacks such as disconnection or deflection (side etching) of the polysilicon wiring.

If the reduction of the pattern dimension of the photoresist 15 is promoted significantly according to the prior art technology, it becomes impossible to maintain a sufficient mask thickness for etching the SiON film 14 and the SiN film 13. Even when assuming that sufficient mask thickness is ensured, the photoresist pattern has its film thickness reduced, according to which the resistance to plasma is significantly deteriorated, causing drawbacks such as pattern deflection.

Figure 3B:
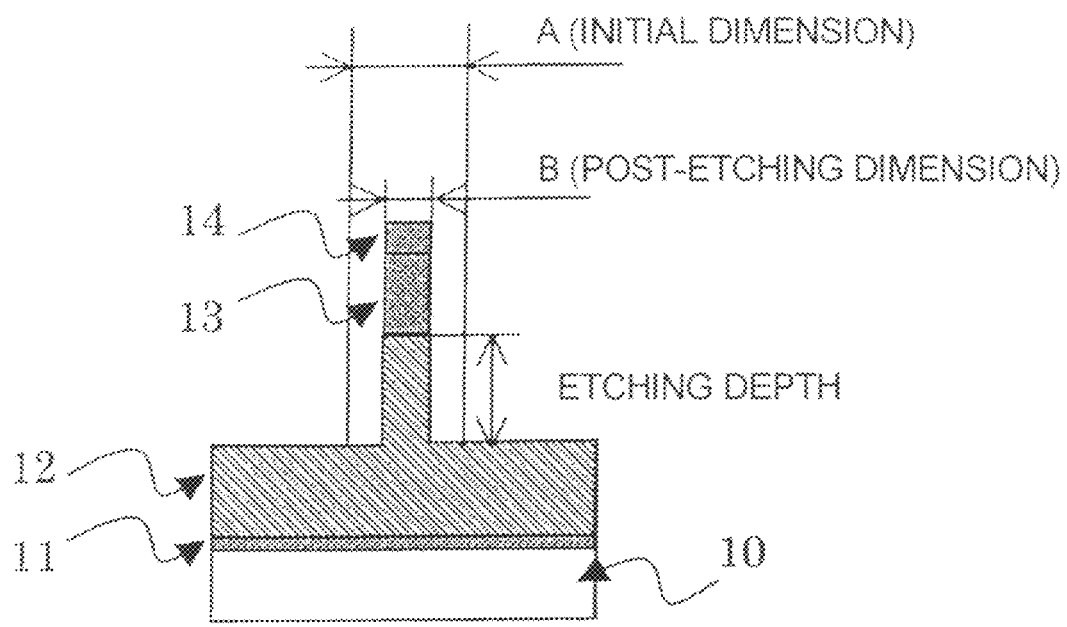
FIG. 3B is a drawing illustrating the etching depth and the lateral direction etching of the mask according to FIG. 3A.

Moreover, the processing conditions of the process of FIG. 2D (wherein the ratio of $Cl_2$ gas to $CF_4$ gas is 1:3) is a condition optimized to correspond to the sample of the present embodiment, and the amount of $CF_4$ to be added should preferably be within the range of 40 to 90% from the viewpoint of shape control. If the amount of $CF_4$ being added is 40% or smaller, the etching performed by fluorine in the lateral direction will not progress effectively, and it becomes difficult to reduce the pattern dimension. On the other hand, if the amount of $CF_4$ being added is 90% or greater, the isotropic etching by fluoride becomes intense, by which the side etching is performed intensely and the perpendicular profile will not be maintained. Other than the reduction rate control method shown in FIG. 3, in other words, other than the above-mentioned processing conditions, the reduction rate can also be controlled by adding $O_2$ gas to the $Cl_2$ gas and $CF_4$ gas, or fluorine-containing gas such as $CHF_3$, $SF_6$ and $NF_3$, or by using fluorine-containing gas such as $CHF_3$, $SF_6$ and $NF_3$ instead of the $CF_4$ gas. Similarly, the reduction rate can also be controlled by using a halogen-based gas such as HBr gas instead of the $Cl_2$ gas.

The present embodiment discloses process conditions optimized with respect to the sample of a semiconductor device, and the method for etching the polysilicon film 12, the SiN film 13, the SiON film 14 and the photoresist 15 is not restricted to the conditions of the present embodiment.

Though the present invention is described with reference to the wiring process of polysilicon, it is not restricted thereto, and the present invention can also be applied to wiring processes of materials other than polysilicon in a semiconductor device manufacturing process. For example, the present invention can be applied to the wiring process of an object having tungsten silicide (WSi) film formed on a polysilicon film 12, and further having an SiN film 13, an SiON film 14, a photoresist 15 and the like formed thereon. Since the reduction rate varies according to the material to be processed, it is preferable to seek the appropriate gas or the appropriate processing conditions corresponding to the material.

A sample having a photoresist mask is used in the present embodiment, but the present invention can be applied to samples using an inorganic film mask such as SiN, SiON and $SiO_2$, in other words, samples having the photoresist 15 of FIG. 2D removed.

Further, the present embodiment utilizes a plasma etching apparatus using microwaves and magnetic fields, but the present invention can be applied regardless of how plasma is generated. For example, equivalent effects can be achieved by applying the present invention to a helicon wave plasma etching apparatus, an inductively-coupled plasma etching apparatus, a capacitively-coupled plasma etching apparatus and so on.

What is claimed is:

1. A dry etching method for forming a wiring using a plasma etching apparatus, by etching a material to be etched using a mask pattern having a mask pattern dimension and being composed of a photoresist and an inorganic film disposed on the material to be etched, the method comprising:
   a step of etching the inorganic film using the photoresist as a mask pattern for etching the inorganic film;
   a step of etching the material to be etched using a mixed gas composed of a halogen-based gas, at least one fluorine-containing gas selected from a group consisting of $CF_4$, $CHF_3$, $SF_6$, and $NF_3$, and $O_2$ gas, until the inorganic film to which etching is performed is reduced to a desired mask pattern dimension; and
   a step of etching a remainder of the material to be etched to which etching is performed, using the inorganic film reduced to the desired mask pattern dimension as the mask pattern.

2. The dry etching method according to claim 1, wherein the halogen-based gas is a $Cl_2$ gas, and a flow rate of the fluorine-containing gas is a gas flow rate of 40 to 90 percent of the mixed gas.

3. The dry etching method according to claim 1, wherein the halogen-based gas is a HBr gas, and a flow rate of the fluorine-containing gas is a gas flow rate of 40 to 90 percent of the mixed gas.

4. The dry etching method according to claim 1, wherein in the step of etching the material to be etched using the mixed gas, the inorganic film is simultaneously etched, and etching is performed in both depth and lateral directions.

5. A dry etching method for forming a wiring using a plasma etching apparatus, by etching a material to be etched using a mask pattern having a mask pattern dimension and being composed of a photoresist and an inorganic film disposed on the material to be etched, the method comprising:
   a step of etching the inorganic film using the photoresist as a mask pattern for etching the inorganic film;
   a step of etching the material to be etched using a mixed gas composed of a halogen-based gas and at least one fluorine-containing gas selected from a group consisting of $CF_4$, $CHF_3$, $SF_6$ and $NF_3$, until the inorganic film to which etching is performed is reduced to a desired mask pattern dimension; and
   a step of etching a remainder of the material to be etched to which etching is performed, using the inorganic film reduced to the desired mask pattern dimension as the mask pattern.

6. The dry etching method according to claim 5, wherein the halogen-based gas is a $Cl_2$ gas, and a flow rate of the fluorine-containing gas is a gas flow rate of 40 to 90 percent of the mixed gas.

7. The dry etching method according to claim 5, wherein the halogen-based gas is a HBr gas, and a flow rate of the fluorine-containing gas is a gas flow rate of 40 to 90 percent of the mixed gas.

8. The dry etching method according to claim 5, wherein in the step of etching the material to be etched using the mixed gas, the inorganic film is simultaneously etched, and etching is performed in both depth and lateral directions.

* * * * *